(12) United States Patent
Imada et al.

(10) Patent No.: US 6,444,112 B1
(45) Date of Patent: Sep. 3, 2002

(54) MANUFACTURING METHOD OF ELECTRODEPOSITED COPPER FOIL

(75) Inventors: Nobuyuki Imada, Hasuda; Yutaka Hirasawa, Okegawa; Yasuji Hara, Omiya; Naoya Matsushita, Urawa, all of (JP)

(73) Assignee: Mitsui Mining & Smelting Co., Ltd., Tokyo (JP)

(*) Notice: Subject to any disclaimer, the term of this patent is extended or adjusted under 35 U.S.C. 154(b) by 0 days.

(21) Appl. No.: 09/590,528

(22) Filed: Jun. 8, 2000

(30) Foreign Application Priority Data

Jun. 8, 1999 (JP) .............................. 11-161644
Apr. 14, 2000 (JP) ........................ 2000-113655

(51) Int. Cl.$^7$ .............................. C25D 3/04; C25D 1/04
(52) U.S. Cl. ......................................... 205/586; 205/76
(58) Field of Search ................................ 205/586, 152, 205/76

(56) References Cited

U.S. PATENT DOCUMENTS 5,407,556 A * 4/1995 Shimada et al. .............. 205/77

FOREIGN PATENT DOCUMENTS

JP   06146051   5/1994
JP   06146052   5/1994

* cited by examiner

Primary Examiner—Edna Wong
(74) Attorney, Agent, or Firm—Webb Ziesenheim Logsdon Orkin & Hanson, P.C.

(57) ABSTRACT

A process for producing an electrodeposited copper foil, comprising electrodepositing a copper foil from an electrolyte containing copper sulfate dissolved therein, in which said electrolyte contains a small amount of lead (Pb) ions, which comprises adding a salt of a metal of Group IIA of the periodic table to the electrolyte in an amount of 10 to 150 mols per mol of lead (Pb) ions contained in the electrolyte so that the lead (Pb) ions contained in the electrolyte react with the metal of Group IIA of the periodic table to thereby form an insoluble composite substance to precipitate, the insoluble composite substance followed by removing it from the electrolyte and forming an electrodeposited copper foil in the electrolyte having the lead (Pb) ions removed therefrom.

9 Claims, 1 Drawing Sheet

MANUFACTURING METHOD OF ELECTRODEPOSITED COPPER FOIL

FIELD OF THE INVENTION

The present invention relates to a process for producing an electrodeposited copper foil, an electrodeposited copper foil obtained by such a process, a copper-clad laminate for which the electrodeposited copper foil is used and a printed wiring board. More particularly, the present invention relates to a producing process of an electrodeposited copper foil in which lead (Pb) ions contained as impurities in the electrolyte are removed to thereby prevent codeposition of fine particles (fine powder) of Pb and/or Pb compounds (mainly lead oxides); and an electrodeposited copper foil produced by the process, which is substantially free from fine particles of Pb and/or Pb compounds. The present invention further relates to a copper-clad laminate produced using the electrodeposited copper foil, which comprises a substrate having at least one side thereof laminated with the electrodeposited copper foil; and a printed wiring board produced using the electrodeposited copper foil.

BACKGROUND OF THE INVENTION

In the continuous production of an electrodeposited copper foil, it is common practice to arrange a cylindrical drum as a cathode and, opposite thereto, an insoluble anode in an electrolyte in which a copper material such as copper sulfate is dissolved and to carry out electrolysis so that copper is electrodeposited on the surface of the cylindrical drum.

In recent years, electronic equipment is being miniaturized and densified, and accordingly circuit widths and circuit spacings of printed wiring boards used in such electronic equipment are being reduced. The use of a thin electrodeposited copper foil with low surface roughness (profile) is desired in accordance with the above reduction of circuit widths and circuit spacings.

Though the surface profile of electrodeposited copper foil is apt to be lowered with reduction in the thickness of the electrodeposited copper foil, there are various methods for further lowering the surface profile. For example, the surface profile of electrodeposited copper foils can be controlled by adjusting the Cl ion (chloride ion) concentration of the electrolyte. In particular, the electrodeposited copper foil with low surface profile that enables forming a fine-pitch wiring pattern can be produced by adjusting the Cl ion concentration of the electrolyte so as to be a given range.

However, when lead (Pb) ions are contained as impurities in the electrolyte in the production of electrodeposited copper foils with the use of an electrolyte of low Cl ion concentration, co-deposition of dendrite-like fine particles of Pb with copper may be experienced. The diameter of the thus co-deposited fine particles of Pb is generally in the range of 1 to 50 $\mu$m, frequently 5 to 30 $\mu$m. Fine particles of Pb are often deposited in the vicinity of the surface of electrodeposited copper foil. In such electrodeposition, Pb compounds such as lead oxides may be co-deposited as fine particles, in addition to the fine particles of Pb.

These co-deposited fine particles of Pb, etc., although few problems are caused thereby when the circuit widths are large as before, tend to cause such problems that copper foil circuits are discontinuous and circuits are broken since the thickness of the copper foil is reduced in accordance with the aforementioned reduction of circuit widths. Further, since the fine particles of Pb can not be removed from the copper foil by the conventional etching technique, the fine particles of Pb may cause short circuit of printed wiring board using the copper foil.

Generally, the surface of the thus electrodeposited copper foil is provided with various treatments in order to impart required properties to the resultant circuit pattern or printed wiring board. For example, the surface of the electrodeposited copper foil is roughened at a limiting current density or over and subjected to various platings such as zinc plating, tin plating and nickel plating, and the surface of the thus formed plate layer is subjected to chromate treatment and silane coupling agent treatments.

When these various treatments are performed on the copper foil surface, it is extremely difficult to detect fine particles of Pb co-deposited into the copper foil. Therefore, in the industrial process for producing wiring boards, it is practically infeasible to identify portions of co-deposition of Pb fine particles in the produced electrodeposited copper foil and to arrange the process so that such portions are substantially not utilized.

In this connection, it is common practice to use an electrode (anode) of a lead alloy in the above production of electrodeposited copper foils using a cylindrical drum. When a lead alloy is used as an anode, leaching of lead into the electrolyte is likely to occur. It is known that, when lead is leached to thereby cause the concentration of Pb ions in the electrolyte to increase to a given level or over, the Pb ions are co-deposited into the copper foil (reference is made to, for example, Japanese Patent Application Publication (unexamined) Nos. Hei 6-146051 and Hei 6-146052).

These publications disclose the effect that the addition of strontium carbonate is effective in the removal of lead ions from the electrolyte containing lead ions as impurities. Specifically, it is described that, when the concentration of lead ions is relatively high as, for example, in the case where an electrode containing lead is used as an anode, the lead ions contained in the electrolyte can be eliminated by adding strontium carbonate, and that the thus formed lead/strontium composite can be removed with relatively high efficiency by filtering the electrolyte.

However, for accomplishing the co-deposition of the lead/strontium composite, it is requisite that the concentration of lead ions in the electrolyte be relatively high. Therefore, in the case where no lead containing electrode is employed, it is extremely difficult to eliminate lead ions having been mixed in an extremely small amount into the electrolyte in the production of the electrolyte by the above addition of strontium electrolyte and remove the precipitate by filtration.

As apparent from the above, in the process for producing an electrodeposited copper foil through deposition of copper on a cylindrical drum in an electrolyte containing an extremely small amount of lead ions as conducted in the present invention, no technology has been established for effectively preventing a small amount of fine particles of lead from being contained in the electrodeposited copper foil by relatively simple operation such as filtration.

The present invention provides a process in which co-deposition of fine particles of lead can effectively be prevented in the deposition of a copper foil from an electrolyte containing copper sulfate dissolved therein with the use of a cylindrical drum as a cathode.

The present invention also provides an electrodeposited copper foil substantially free from any fine particles of Pb and/or Pb compounds, which electrodeposited copper foil is obtained by electrodeposition from an electrolyte containing copper sulfate dissolved therein with the use of a cylindrical drum as a cathode.

The present invention further provides a copper-clad laminate comprising an insulating substrate comprising the above electrodeposited copper foil substantially free from any fine particles of Pb and/or Pb compounds, which copper foil is laminated on the surface of the substrate, and to provide a printed wiring board furnished with a desirable wiring pattern, which printed wiring board is produced from the electrodeposited copper foil substantially free from any fine particles of Pb and/or Pb compounds.

SUMMARY OF THE INVENTION

In one aspect of the present invention, there is provided a process for producing an electrodeposited copper foil, said copper foil being electrodeposited from an electrolyte containing copper sulfate dissolved therein, in which said electrolyte contains a small amount of lead (Pb) ions, which comprises adding a salt of a metal of Group IIA of the periodic table to the electrolyte in an amount of 10 to 150 mol per mol of lead (Pb) ions contained in the electrolyte so that the lead (Pb) ions contained in the electrolyte is precipitated as an insoluble composite substance with the metal of Group IIA of the periodic table, removing insoluble composite substance from the electrolyte, and forming an electrodeposited copper foil from the electrolyte of which the lead (Pb) ions have been removed therefrom.

The electrodeposited copper foil of the present invention is produced by the above process and substantially free from any fine particles of Pb and/or Pb compounds.

Thus, in another aspect of the present invention, there is provided an electrodeposited copper foil produced by a process for producing an electrodeposited copper foil, said copper foil being electrodeposited from an electrolyte containing copper sulfate dissolved therein, in which said electrolyte contains a small amount of lead (Pb) ions, which comprises adding a salt of a metal of Group IIA of the periodic table to the electrolyte in an amount of 10 to 150 mol per mol of lead (Pb) ions contained in the electrolyte so that the lead (Pb) ions contained in the electrolyte is deposited as an insoluble composite substance with the metal of Group IIA of the periodic table, removing insoluble composite substance from the electrolyte, and forming an electrodeposited copper foil from the electrolyte of which the lead (Pb) ions have been removed therefrom.

The copper-clad laminate of the present invention comprises an insulating substrate and the above electrodeposited copper foil is substantially free from any fine particles of Pb and/or Pb compound (mainly lead oxides), which copper foil is laminated on at least one surface of the substrate.

Accordingly, in a further aspect of the present invention, there is provided a copper-clad laminate comprising an insulating substrate and an electrodeposited copper foil laminated on at least one surface thereof, which is produced by a process for producing electrodeposited copper foil, said copper foil is electrodeposited from an electrolyte containing copper sulfate dissolved therein, in which said electrolyte contains a small amount of lead (Pb) ions, which comprises adding a salt of a metal of Group IIA of the periodic table to the electrolyte in an amount of 10 to 150 mol per mol of lead (Pb) ions contained in the electrolyte so that the lead (Pb) ions contained in the electrolyte is eliminated as an insoluble composite substance with the metal of Group IIA of the periodic table, removing insoluble composite substance from the electrolyte, and forming an electrodeposited copper foil from the electrolyte of which the lead (Pb) ions have been removed therefrom.

Still further, the printed wiring board of the present invention is produced by treating the electrodeposited copper foil of the above copper-clad laminate comprising an insulating substrate comprising the electrodeposited copper foil substantially free from any fine particles of Pb and/or Pb compound (mainly lead oxides), which copper foil is laminated on at least one surface of the substrate, so as to form a desirable wiring pattern.

Thus, in a still further aspect of the present invention, there is provided a printed wiring board furnished with a desirable wiring pattern, produced by etching at its electrodeposited copper foil on a copper-clad laminate comprising an insulating substrate and an electrodeposited copper foil laminated on at least one surface thereof, which is produced by a process for producing an electrodeposited copper foil, said copper foil being electrodeposited from an electrolyte containing copper sulfate is dissolved therein, in which said electrolyte contains a small amount of lead (Pb) ions, which comprises adding a salt of a metal of Group IIA of the periodic table to the electrolyte in an amount of 10 to 150 mols per mol of lead (Pb) ions contained in the electrolyte so that the lead (Pb) ions contained in the electrolyte are precipitated as an insoluble composite substance with the metal of Group ILA of the periodic table, removing insoluble composite substance from the electrolyte, and forming an electrodeposited copper foil in the electrolyte of which the lead (Pb) ions have been removed therefrom.

The present invention has been completed on the basis of such findings that, when a small amount of lead (Pb) ions is contained in the electrolyte, the addition of a salt of a metal of Group IIA of the periodic table in a specified amount relative to the amount of lead (Pb) ions contained in the electrolyte causes the small amount of lead (Pb) ions contained in the electrolyte to precipitate with the added metal of Group IIA of the periodic table and that the precipitate can be removed by a customary separating operation such as filtration.

It is preferred that the electrolyte used in the process for producing electrodeposited copper foil of the invention have a chloride ion ($Cl^-$) concentration adjusted in the range of 0.1 to 5.0 mg/l, in order to make the rough surface of the copper foil have even surface roughness (profile).

DETAILED DESCRIPTION OF THE INVENTION

Figure 1:
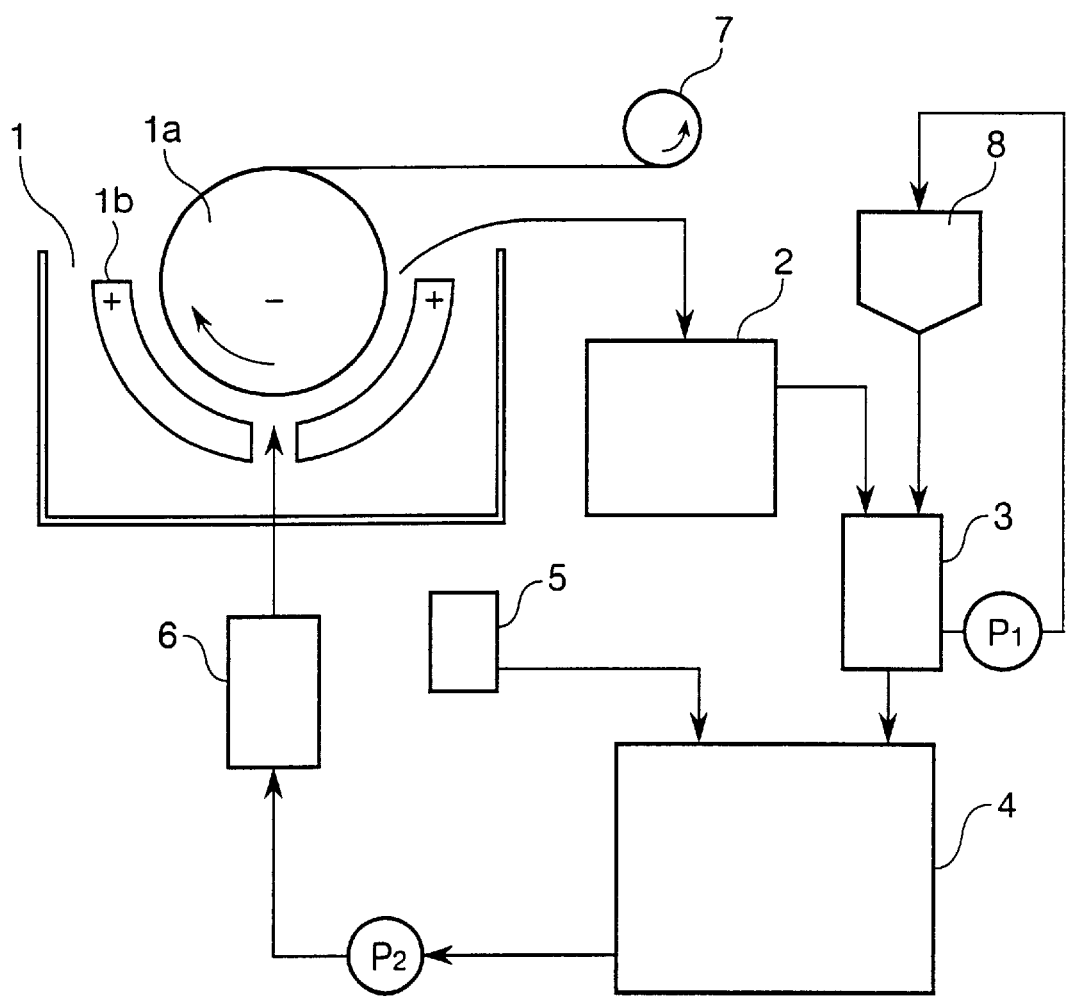
FIG. 1 shows a schematic view of an embodiment of process flow for producing an electrodeposited copper foil according to the present invention.

Process for Producing Electrodeposited Copper Foil and Electrodeposited Copper Foil In the process for producing an electrodeposited copper foil according to the present invention, referring to FIG. 1, use is made of an apparatus comprising electroforming cell 1 filled with an electrolyte containing copper sulfate dissolved therein, in which cathode drum 1a whose surface is generally made of Ti or Ti alloy is immersed and rotatably arranged. Referring further to FIG. 1, the apparatus for use in the process for producing an electrodeposited copper foil according to the present invention is generally equipped with electroforming cell 1, spent solution tank 2, copper dissolving and circulating tank 3, supply solution storage tank 4, additives tank 5, filter 6, roll winder 7, copper dissolving tower 8, dissolving circulation pump P1 and solution supply pump P2.

The electrolyte to be fed into the electroforming cell 1 is prepared by feeding copper raw materials into the copper dissolving tower 8 and dissolving the copper raw materials in a spent solution returned from the spent solution tank 2 to the copper dissolving tower 8. The spent solution used herein is the electrolyte having overflowed from the electroforming cell 1, which is used after recovering the overflowed electrolyte in the spent solution tank 2 and then transporting it to the dissolving and circulating tank 3.

For example, copper wire, copper scrap material or copper sulfate can be mentioned as the copper raw materials for use in the present invention. Lead is contained in the copper raw materials although the content thereof is low. The copper material fed as a raw material for electrodeposited copper foil is dissolved in the spent solution as described above, and the copper concentration in the solution in dissolving and circulating tank 3 is adjusted to thereby make up the electrolyte.

When a copper sulfate solution with sulfuric acid as the electrolyte is prepared from such copper raw materials, the small amount of lead contained in the copper raw materials is also dissolved as lead sulfate in the electrolyte. That is, because an extremely small amount of lead is contained in the copper raw materials fed from the copper dissolving tower 8, the production of the copper sulfate electrolyte by dissolving the copper raw materials in the spent solution is accompanied by dissolution in the copper dissolving tower and circulating tank 3 of lead contained in an extremely small amount as well with the result that lead is mixed into the electrolyte. Therefore, the electrolyte prepared in the copper raw materials dissolving tank 3 contains not only copper ions but also lead (Pb) ions as the content thereof is very low.

In recent apparatuses for producing electrodeposited copper foils, lead alloy anodes are no longer used, so that leaching of lead (Pb) ions from the anodes into the electrolytes does not occur. With respect to prior widely employed apparatuses equipped with lead anodes as well, the amount of lead leached from the anodes during the production of electrodeposited copper foils was not so much and, further, the produced copper foils were thick, so that it was extremely rare that fine particles of lead co-deposited with copper on the surface of the cathode drum caused problems. Moreover, when lead alloys are used as the anodes, the lead leached into the electrolytes is able to be removed by adding strontium carbonate. When lead containing electrodes were used, the amount of lead removed by the addition of strontium carbonate was high to an extent that, after the addition of strontium carbonate, the lead (Pb) ions could be removed with relatively high efficiency by physical methods such as filtration, centrifugation and decantation. However, in most of recent apparatuses in which lead alloys are not used in the anodes, the amount of dissolved lead (Pb) ions is extremely small as compared with that of the prior electrolytes, so that, even if a lead/strontium composite is formed by adding strontium carbonate to the electrolyte containing such a small amount of lead (Pb) ions, the size of formed composite compound does not grow to such an extent that lead (Pb) ions can be efficiently removed by custom methods. Therefore, in most of recent apparatuses, it is extremely difficult to remove lead (Pb) ions from the electrolytes. Moreover, the extremely small amount of lead dissolved in the electrolyte are occasionally deposited as oxides on the surface of the anode to reduce the life thereof and the deposited lead oxides are sometimes separated from the anode to be mixed as contaminants into the resultant copper foil.

Even if lead (Pb) ions present in the electrolyte are in a small amount, they are deposited with copper on the surface of the cathode drum. Extremely fine wirings whose pattern width is about 10 to 50 $\mu$m are formed with the use of the thus produced thin electrodeposited copper foil. When a small amount of lead (Pb) ions is dissolved in the electrolyte, the average diameter of fine p articles of lead co-deposited with copper may be as large as 20 to 50 $\mu$m. In such case, when a wiring pattern having pitch as small as 30 to 100 $\mu$m is formed by using the electrodeposited copper foil, the wiring pattern to be provided on the electrodeposited copper foil is partly replaced by fine particles of lead. As a result, the resultant wiring pattern causes such a problem that the formed wiring pattern does not exhibit desired properties.

In order to remove the small amount of lead (Pb) ions dissolved in the electrolyte, for example, an electrical method comprising passing microcurrent through the electrolyte to thereby selectively remove lead (Pb) ions has been recently employed for accomplishing the removal of an extremely small amount of lead (Pb) ions contained in the electrolyte.

The inventors have found that the addition of a salt of metal of Group IIA of the periodic table is effective in removing lead (Pb) ions from the electrolyte containing a small amount of lead (Pb) ions, as utterly different from the above electrochemical method of removing a small amount of lead (Pb) ions.

That is, by controlling a salt of a metal of Group IIA of the periodic table added to the electrolyte, the formed composites of lead and a metal of Group IIA of the periodic table can be made capable of removing by physical means, such as filtration and centrifugation.

Therefore, effecting the removal of this lead/Group IIA metal composite before the electrolyte reaches the electroforming cell 1 causes the electrolyte introduced into the electroforming cell 1 to be substantially free of lead (Pb) ions, so that the co-deposition of fine particles of lead on the surface of the cathode drum can be effectively prevented.

The process for producing an electrodeposited copper foil according to the present invention will be described in detail below with reference to FIG. 1.

In the production apparatus of FIG. 1, the electrolyte containing copper sulfate flows between the cylindrical drum cathodes (in FIG. 1, indicated as 1a) and anodes (in FIG. 1, indicated as 1b) arranged along with the drum so as to keep a predetermined distance from the drum, and a sufficient voltage for electrodepositing copper is applied between the drum cathodes and the anodes, to thereby electrodeposit copper on the surface of the cathode drum. The copper foil thus having a predetermined thickness is continuously separated and wound around the roll winder 7. The electrolyte having been supplied between both electrodes to consume copper ions (in the present invention, it may be referred to as a spent solution) overflows and is continuously returned to the spent solution tank 2. The spent solution is fed from the spent solution tank 2 to the dissolving and circulating tank 3. The solution in the dissolving and circulating tank 3 is fed to the dissolving tower 8 in which the copper raw materials are introduced. The solution contacts the copper raw materials in the tower 8 to dissolve copper, followed by returning to the dissolving and circulating tank. Supplement of copper ions is carried out by the circulation of the spent solution between the dissolving and circulating tank 3 and the dissolving tower 8. After the dissolution of copper, the electrolyte is fed to the supply solution storage tank 4. A conduit from the additives tank 5 is fitted in the supply solution storage tank 4. This additives tank 5 is so designed that a salt of a metal of Group IIA of the periodic table, a Cl ion containing compound and optionally other additives described later can be placed simultaneously or separately in the supply solution storage tank 4.

After the addition of the salt of metal of Group IIA of the periodic table, the generated solid substance (precipitate) in the solution is removed by the filter 6 and the filtrated solution is fed as an electrolyte-supplying solution to the electroforming cell again.

The electrodeposited copper foil produced by the producing process of the present invention has a shiny (glossy) surface of the anode drum side and a matte (rough) surface of the electrodeposited side.

For example, metals such as Be, Mg, Ca, Sr, Ba and Ra can be mentioned as the metal of Group IIA of the periodic table for use in the present invention. In the present invention, the metals of Group IIA of the periodic table can be used either individually or in combination. Of these metals of Group IIA of the periodic table, Ca, Sr and Ba are especially preferred in the present invention. In the present invention, these metals of Group IIA of the periodic table are generally used in the form of a carbonate. Therefore, among the salts of metals of Group IIA of the periodic table, calcium carbonate ($CaCO_3$), strontium carbonate ($SrCO_3$) and barium carbonate ($BaCO_3$) can be mentioned as preferred examples in the present invention. These carbonates of metals of Group IIA of the periodic table can be used either individually or in combination. Beryllium carbonate and magnesium carbonate, although they can form a composite compound with lead (Pb) ions, exhibit higher solubility in the electrolyte than calcium carbonate, strontium carbonate or barium carbonate, so that when beryllium carbonate and magnesium carbonate are used, beryllium and magnesium ions are contained in the electrolyte in significant concentrations. The presence of these ions cannot be stated as being suitable in the electrodeposition of copper. Further, radium is so expensive that the availability thereof is low in the industrial removal of lead (Pb) ions.

These salts of metals of Group IIA of the periodic table are added to the electrolyte in an amount of 10 to 150 mol per mol of lead (Pb) ions contained in the electrolyte. In the present invention, it is especially preferred that these salts of metals of Group IIA of the periodic table be added to the electrolyte in an amount of 20 to 120 mol per mol of lead (Pb) ions contained in the electrolyte. When these salts of metals of Group IIA of the periodic table are added to the electrolyte in the above amount per lead (Pb) ions contained in the electrolyte, the lead (Pb) ions dissolved in the electrolyte react with the metal of Group IIA of the periodic table to thereby form an insoluble composite substance and are precipitated. The thus formed insoluble composite substance grows to such a size that physical separating operation such as filtration is available by virtue of regulating the Cl ion concentration of the electrolyte so as to be within the above specified range.

One embodiment of the present invention using strontium carbonate ($SrCO_3$) as an added salt of metal of Group IIA of the periodic table will be described in detail below. In the process of the present invention, the strontium carbonate ($SrCO_3$) as a salt of metal of Group IIA of the periodic table is generally added in an amount of 8 to 100 g/g of Pb, preferably 10 to 70 g/g of Pb. The lead (Pb) ions contained in the electrolyte can efficiently be removed by adding the above amount of strontium carbonate. That is, when the amount of strontium carbonate is less than 8 g/g of Pb (Pb ion), the lead (Pb) ions cannot be efficiently removed. On the other hand, even if strontium carbonate is added in excess of 100 g/g of Pb, the Pb ion removing effect cannot be further enhanced.

When calcium carbonate ($CaCO_3$) is used, the amount thereof is generally in the range of 3 to 30 g/g of Pb, preferably 5 to 25 g/g of Pb. The lead (Pb) ions contained in the electrolyte can efficiently be removed by adding the above amount of strontium carbonate. Further, when barium carbonate ($BaCO_3$) is used, the amount thereof is generally in the range of 30 to 150 g/g of Pb, preferably 35 to 120 g/g of Pb.

When the salt of strontium is added, it is preferred that the Cl ion concentration of the electrolyte be adjusted so as to be within the range of 0.1 to 5.0 mg/liter, preferably 0.5 to 3.5 mg/liter. When the chloride concentration is within the range of 0.1 to 5.0 mg, the lead ions contained in the electrolyte can efficiently be removed. By employing the salt of metal of Group IIA of the periodic table in the above amount per the lead ions contained in the electrolyte, the lead ions contained in the electrolyte form the insoluble composite substance and are precipitated. Further, by controlling the chloride concentration in the electrolyte within the above range, the formed insoluble composite substance grows to such an extent that the physical separation operation such as filtration is effective. It is presumed that, when the salt of metal (including strontium) of Group IIA of the periodic table is added to the electrolyte containing copper sulfate under the condition that the chloride concentration is 0.1 to 5.0 mg/liter, the Pb ions contained as impurities in the electrolyte react dominantly with the metal of Group IIA of the periodic table in the acidic electrolyte containing sulfuric acid to form and generate the lead/Group IIA metal composite substances and then the generated substance grows to particles capable of precipitating in the acidic electrolyte containing sulfuric acid, which contains the above amount of chloride ion. In this connection, Japanese Patent Publication (unexamined) Nos. 6(1994)-146051 and 6(1994)-146052 teach that when strontium carbon ate is added to an electrolyte containing lead at a low concentration, there are formed only fine flocs of lead sulfate which cannot be sufficiently removed because of their fineness. On the contrary, the inventors have found that when the concentration of chloride ions is adjusted within the above specific range and the salt of metal of Group IIA of the periodic table is added to the electrolyte thus adjusted in its chloride-ion concentration in the above specific amount per Pb ions in the electrolyte, as employed in the process of the invention, the extremely small amount of Pb ions dissolved in the electrolyte becomes the lead/metal of Group IIA composite substance to grow to the precipitate capable of filtrating, and that the Pb ions in the electrolyte can be removed with remarkably high efficiency by removing the precipitate.

In the case where salt of barium or calcium is added, the chloride ion concentration may be adjusted within the range of 0.1 to 5.0 mg/liter, preferably 0.5 to 3.5 mg/liter. By adjusting the chloride ion concentration within the above range, it becomes easy to separate the lead ions as the insoluble composite substance.

Further, the chloride ion concentration adjusted within the above range makes the resultant electrodeposited copper foil have high tensile strength and good elongation.

Further, the copper concentration (copper ion concentration) of the electrolyte stored in the supply solution storage tank 4 and fed to the electroforming cell 1 is generally adjusted within the range of 30 to 100 g/liter, preferably 50 to 90 g/liter, and the sulfuric acid ($H_2SO_4$)

concentration of this electrolyte is generally adjusted within the range of 50 to 300 g/liter, preferably 100 to 250 g/liter.

In the electrolyte containing copper sulfate in the above range, lead components (mainly, lead (Pb) ions) are dissolved as impurities generally 1 to 50 mg/liter, often 5 to 30 mg/liter. The process of the present invention is especially effective in separating a small amount of lead (Pb) ions contained as impurities in the electrolyte of the above composition in the form of an insoluble compound. In many cases, the lead components contained as impurities are often those contained as impurities in the copper raw materials such as copper scrap material. However, even when copper sulfate is used as the copper raw materials, lead ions may also be contained therein. Moreover, when parts formed of lead remain in cell and tank linings, pipes and the like, although rare in recent apparatuses, leaching of lead components from such portions as well would occur.

The removal of such a small amount of lead (Pb) ions from the electrolyte is accomplished by precipitating the small amount of dissolved lead (Pb) ions as a composite substance of lead and the metal of Group IIA of the periodic table and separating the composite substance by physical separating means such as a filter, for example, one indicated by 6 in FIG. 1. The electrolyte having the composite substance removed therefrom is fed to the electroforming cell 1. A centrifuge can be mentioned as the physical separating means other than the filter 6. Examples of especially suitable filters 6 include a membrane filter, a cartridge filter and a precoat filter.

The amount of lead (Pb) ions dissolved in the electrolyte is generally reduced to 1.0 mg/liter or less, preferably 0.5 mg/liter or less, by the above addition of the salt of metal of Group IIA of the periodic table.

The transport of the electrolyte through the filter 6 into the electroforming cell 1 is accomplished by feeding the electrolyte from the supply solution storage tank 4 to the filter 6 with the use of pump P2, while separating the precipitate of lead/Group IIA metal composite by the filter 6 and feeding the resultant electrolyte to the electroforming cell 1 under the pressure applied by the pump P2. The electrolyte is preferably introduced into the electroforming cell 1 in such a manner that it enters into the electroforming cell 1 through a lower end part thereof and passes through the gap between the cathode drum 1a and anode electrode 1b disposed in the electroforming cell 1.

The electrodeposited copper foil substantially free from any fine particles of lead can be produced by passing the electrolyte thus introduced in the electroplating bath 1 through the gap between the cathode drum electrode 1a and the anode electrodes 1b for electrodeposition having the curvature substantially corresponding to that of the cathode drum electrode 1a and continuously electrodepositing copper from the electrolyte on the surface of the cathode drum electrode 1a under such conditions that the temperature of the electrolyte is adjusted within the range of 30 to 80° C. and that the current density between the cathode drum electrode 1a and the anode 1b is set at 8 to 100 A/dm$^2$.

The electrolyte for use in the process of the present invention is a solution which contains copper sulfate dissolved therein as aforementioned, has Cl ion concentration adjusted within the range of 0.1 to 5.0 mg/liter and contains lead (Pb) ions as impurities. Further, this electrolyte may optionally contain conventional additives. Examples of such additives include glue, gelatin, glucose, thiourea, glycine, polyethylene glycol, triethanolamine and hydrazine. These additives can be used either individually or in combination.

For example, glue or gelatin can be used as a main additive in combination with other additives (for example, glucose, thiourea, glycine, polyethylene glycol, triethanolamine, hydrazine, etc.).

When a carbonate of metal of Group IIA of the periodic table, such as calcium carbonate, strontium carbonate or barium carbonate, is added to the electrolyte, part of the metal forms a sulfate with the result that the free sulfuric acid concentration of the electrolyte may be lowered. In such a case, the composition of the electrolyte can be adjusted by further adding sulfuric acid, copper sulfate or the like.

The electrodeposited copper foil can continuously be produced by rotating the cathode drum 1a immersed in the electrolyte having the above components and having lead (Pb) ions removed therefrom, while applying voltage thereto.

The electrodeposited copper foil formed on the surface of the cathode drum 1a is wound on the roll winder 7 as shown in FIG. 1. The average thickness of the thus produced electrodeposited copper foil is generally in the range of 8 to 150 $\mu$m. Substantially no fine particles of Pb are co-deposited in the obtained electrodeposited copper foil because, prior to the deposition of copper, lead (Pb) ions contained as impurities have been removed from the electrolyte.

Substantially no fine particles of Pb are co-deposited in the electrodeposited copper foil thus produced by the process of the present invention, so that the electrodeposited copper foil is suitable to a copper foil for use in the production of excellent printed wiring boards.

That is, a copper-clad laminate can be produced by laminating at least one side of an insulating substrate with the electrodeposited copper foil produced in the above manner. Further, a printed wiring board can be produced by forming a desired pattern on the thus obtained copper-clad laminate by exposing and developing a photoresist and etching the electrodeposited copper foil of the copper-clad laminate masked with the photoresist. Moreover, a multilayer laminated printed wiring board can be produced by uniting the thus produced printed wiring boards arranged one upon another while forming wiring patterns in the same manner as mentioned above.

Prior to the use of the thus produced electrodeposited copper foil, it is preferred that, if necessary, a layer of particulate copper electrodeposit be formed on the surface of the matte side (rough side, side finished with copper electrodeposition) of the electrodeposited copper foil. The treatment for forming this layer of particulate copper electrodeposit is referred to as "modulation" or "roughening treatment".

The nodulation is a treatment comprising arranging the electrodeposited copper foil so as to cause the matte side (rough side) thereof to face an anode and depositing copper on the matte side in a plating solution containing copper ions. In this nodulation, generally, a burn plating, a seal (covering) plating and a whisker plating are performed in sequence.

The burn plating, for example, comprises arranging the electrodeposited copper foil produced in the above manner so as to make the matte side (rough side) thereof to face an anode and plating copper on the matte side under the following conditions:

copper concentration of solution: 5 to 30 g/liter,
concentration of sulfuric acid in solution: 50 to 150 g/liter,
temperature of solution: 20 to 30° C., current density: 20 to 40 A/dm$^2$, and
plating time: 5 to 15 sec.

As a result of this plating of the matte side of the electrodeposited copper foil under the above conditions, a twiglike copper electrodeposit called "burnt deposit" is formed on the matte side (rough side).

The matte side having undergone the burn plating is subjected to the seal plating. The seal plating, for example, comprises further plating copper on the matte side of the electrodeposited copper foil having undergone the above burn plating under the following conditions:

copper concentration of solution: 40 to 80 g/liter,
concentration of sulfuric acid in solution: 50 to 150 g/liter,
temperature of solution: 45 to 55° C.,
current density: 20 to 40 A/dm$^2$, and
plating time: 5 to 15 sec.

The surface of the matte side having undergone the seal plating under the above conditions is further subjected to the whisker plating. The whisker plating, for example, comprises further plating copper on the matte side having undergone the above seal plating under the following conditions:

copper concentration of solution: 5 to 30 g/liter,
concentration of sulfuric acid in solution: 30 to 60 g/liter,
temperature of solution: 20 to 30° C.,
current density: 10 to 40 A/dm$^2$, and
plating time: 5 to 15 sec.

As a result of the whisker plating of the matte side having undergone the seal plating under the above conditions, whiskerlike copper is formed on the covering plating layer (coating layer of copper).

The thus nodulated or roughened electrodeposited copper foil is preferably followed by passivation.

The passivation to be employed in the present invention is not particularly limited, and it may be, for example, a passivation plating such as zinc plating or tin plating. In such a passivation plating, e.g., a zinc plating, use is made of an electrolyte in which zinc sulfate, zinc pyrophosphate or the like is dissolved.

After the passivation plating, the surface having undergone the passivation plating is preferably treated with chromate. In this chromate treatment, generally, the electrodeposited copper foil having undergone the passivation plating is immersed in a solution containing 0.2 to 5 g/liter of chromic anhydride and having a pH value adjusted to 9–13, and the matte side of the electrodeposited copper foil is treated at a current density of 0.1 to 3 A/dm$^2$. The period of treatment is generally about 1 to 8 sec.

After the chromate treatment, the surface of the electrodeposited copper foil is preferably treated with a silane coupling agent.

In this silane coupling agent treatment, generally, use is made of any of silane coupling agents such as an epoxyalkoxysilane, an aminoalkoxysilane, a methacryloxyalkoxysilane and a mercaptoalkoxysilane. These silane coupling agents can be used either individually or in combination. These silane coupling agents are applied to the surface of the electrodeposited copper foil in an amount of 0.15 to 30 mg/m$^2$, preferably 0.3 to 25 mg/m$^2$, in terms of silicon atom.

The electrodeposited copper foil having undergone the above nodulation or roughening treatment, passivation, plating, chromate treatment and silane coupling agent treatment is especially useful as a copper foil for electronic circuit formation.

Copper-clad Laminate and Printed Wiring Board

The copper-clad laminate can be produced by laminating, on at least one surface of an insulating substrate, the electrodeposited copper foil obtained by the above process with the use of an insulating adhesive or, without the use of adhesives, by hot press.

Resin substrates commonly used in electronic equipments can be employed as the insulating substrate of the copper-clad laminate. For example, use can be made of a paper/phenolic substrate, a paper/epoxy substrate, a glass/epoxy substrate and a glass polyimide substrate.

The printed wiring board can be produced by first applying, for example, a photoresist to the copper foil surface of the thus obtained copper-clad laminate, subsequently exposing and developing the photoresist to thereby form a desired etching resist pattern and thereafter etching the electrodeposited copper foil with the use of the formed pattern as a mask so that the surface of the insulating substrate is overlaid with a wiring pattern resulting from the etching of the copper foil.

The thus obtained printed wiring board comprising the insulating substrate having its surface overlaid with the wiring pattern resulting from the etching of the copper foil can be further laminated through an insulating layer with the electrodeposited copper foil, and this electrodeposited copper foil can be etched in the same manner to thereby form a wiring pattern. Furthermore, the operations of laminating through an insulating layer with the electrodeposited copper foil and forming a wiring pattern can be repeated. Thus, a multilayer printed wiring board can be obtained.

In the process for producing an electrodeposited copper foil according to the present invention, use is made of the copper sulfate electrolyte in which a small amount of lead (Pb) ions is contained as impurities. In the present invention, the specified amount of a salt of metal of Group IIA of the periodic table (for example, calcium carbonate, strontium carbonate or barium carbonate) is added to this electrolyte to thereby cause the lead (Pb) ions contained as impurities to precipitate as a lead/Group IIA metal composite substrate, which grows to a filterable particulate and can be separated.

Therefore, the removal of lead (Pb) ions can be attained by the use of conventional equipment for production without the need to alter electrodeposition conditions. Thus, the electrodeposited copper foil substantially free from any fine particles of Pb (including lead oxides) can be produced by the process of the present invention.

The concentration of the chloride ions contained in the electrolyte adjusted within the range of 0.1 to 5.0 mg/liter makes the rough surface of the resultant electrodeposited copper foil have even surface roughness (profile). Further, when use is made of the electrolyte in which the concentration of the chloride ions is adjusted within the range of 0.1 to 5.0 mg/liter, lead ions are effectively separated as insoluble composite substances and there can be made an electrodeposited copper foil having high tensile strength and good elongation.

In the present invention, since the extremely small amount of lead in the electrolyte is removed, no lead is deposited as oxides on the anode and, therefore, lead oxides can be prevented from separating from the anode to be contained in the copper foil. Further, the life of the anode can be prolonged.

The thus obtained electrodeposited copper foil has suffered from substantially no codeposition of fine particles of Pb, so that it is electrically stable and is highly useful as a copper foil for formation of fine pitch circuits. That is, the copper-clad laminate capable of producing, for example, a printed wiring board furnished with fine pitch circuits can be produced by laminating at least one side of an insulating substrate with the electrodeposited copper foil obtained by the process of the present invention.

Fine pitch circuits of, for example, a pitch of 100 $\mu$m or less and a line width of 50 $\mu$m or less can be easily formed in the production of printed wiring boards using the above electrodeposited copper foil as a copper foil for printed wiring board. Moreover, the electrodeposited copper foil of the present invention is substantially free from any fine particles of Pb, so that such problems that fine particles of Pb replace copper at most fine line portions of circuits to thereby cause an electric property change and that fine lines are broken by fine particles of Pb or short circuits occur at fine line portions can be avoided. Therefore, the electrodeposited copper foil of the present invention enables producing the printed wiring board having a wiring pattern much more reliable than that of conventional electrodeposited copper foils.

EXAMPLE

The present invention will now be illustrated in greater detail with reference to the following Examples, which in no way limit the scope of the invention.

Example 1

Production of Electrodeposited Copper Foil

An electrolyte containing copper ions and sulfuric acid in a concentration of 80 g/liter and 250 g/liter, respectively, was prepared. The Cl ion concentration of this electrolyte was controlled so as to be 3.0 mg/liter. As a result of accurate analysis, it was found that 7.4 mg/liter of lead (Pb) ions attributable to the containment in copper scrap material, etc. were contained in the electrolyte.

In conformity with the amount of lead (Pb) ions contained as impurities, 500 mg/liter of strontium carbonate (68 g/g of Pb, in terms of lead (Pb) ions of the electrolyte, of strontium carbonate, namely, 95 mols of strontium per mol of dissolved lead (Pb) ions) was added to the electrolyte. The electrolyte was slowly agitated to thereby form a lead/strontium composite, and the lead/strontium composite was precipitated. The precipitate was filtered off with the result that the concentration of lead (Pb) ions in the electrolyte became not greater than 0.2 mg/liter.

The electrolyte having lead (Pb) ions removed therefrom was continuously fed into the electroforming cell 1, and copper was deposited on the surface of the cathode plate at a current density of 50 A/dm$^2$. Thus, an electrodeposited copper foil of 35 $\mu$m nominal thickness was continuously produced.

Number of Fine Particles of Pb Detected

Samples of 10 cm×10 cm size electrodeposited copper foil were obtained and immersed in a chemical polishing solution containing 100 g/liter of ammonium persulfate to thereby dissolve the copper foil. After complete dissolution of the copper foil, the chemical polishing solution was filtered through a 0.2 $\mu$m-opening membrane filter. The number of fine particles of Pb remaining on the filter was counted through an optical microscope.

The above operation was performed on five specimens, and the sum of Pb particle numbers was determined as the number of fine particles of Pb per 500 cm$^2$.

Further, the properties (surface profile, tensile strength and elongation) of the obtained electrodeposited copper foil were measured.

The results are specified in Table 1.

Example 2

An electrodeposited copper foil was produced in the same manner as in Example 1 except that strontium carbonate was added so that the concentration of strontium carbonate in the electrolyte was 200 mg/liter (27 g/g of Pb, in terms of lead (Pb) ions of the electrolyte, of strontium carbonate, namely 38 mol of strontium per mol of dissolved lead (Pb) ions).

With respect to the obtained electrodeposited copper foil, the number of fine particles of Pb and the copper foil properties were measured in the same manner as in Example 1.

The results are also specified in Table 1.

Example 3

An electrodeposited copper foil was produced in the same manner as in Example 1 except that strontium carbonate was added so that the concentration of strontium carbonate in the electrolyte was 100 mg/liter (14 g/g of Pb, in terms of lead (Pb) ions of the electrolyte, of strontium carbonate, namely 19 mol of strontium per mol of dissolved lead (Pb) ions).

With respect to the obtained electrodeposited copper foil, the number of fine particles of Pb and the copper foil properties were measured in the same manner as in Example 1.

The results are also specified in Table 1.

Comparative Example 1

An electrodeposited copper foil was produced in the same manner as in Example 1 except that strontium carbonate was added so that the concentration of strontium carbonate in the electrolyte was 50 mg/liter (7 g/g of Pb, in terms of lead (Pb) ions of the electrolyte, of strontium carbonate, namely 9.5 mol of strontium per mol of dissolved lead (Pb) ions).

With respect to the obtained electrodeposited copper foil, the number of fine particles of Pb and the copper foil properties were measured in the same manner as in Example 1.

The results are also specified in Table 1.

Comparative Example 2

An electrodeposited copper foil was produced in the same manner as in Example 1 except that none of strontium carbonate was added.

With respect to the obtained electrodeposited copper foil, the number of fine particles of Pb and the copper foil properties were measured in the same manner as in Example 1.

The results are also specified in Table 1.

TABLE 1

| | Electrolyte | | | Copper foil for printed wiring board | | | | |
|---|---|---|---|---|---|---|---|---|
| | amt. of added SrCO$_3$ | concn. of Pb[1] (mg/L) | concn. or Sr[1] (mg/L) | no. of detected Pb particles (/500 cm$^2$) | matte side profile | | | tensile strength (kg/mm$^2$) | Elongation (%) |
| | | | | | Ra | Rmax | Rz | | |
| Ex. 1 | 500 mg | <0.2 | 14.8 | 0 | 0.61 | 6.3 | 4.1 | 61.4 | 3.8 |
| Ex. 2 | 200 mg | 0.4 | 15.0 | 0 | 0.56 | 5.6 | 3.7 | 60.2 | 4.0 |
| Ex. 3 | 100 mg | 1.0 | 14.6 | 0 | 0.45 | 4.2 | 2.9 | 57.1 | 5.6 |
| Comp. Ex. 1 | 50 mg | 3.8 | 10.2 | 4 | 0.51 | 5.4 | 3.6 | 58.0 | 4.0 |
| Comp. Ex. 2 | 0 | 7.4 | 0.6 | 73 | 0.42 | 3.3 | 2.8 | 57.3 | 5.2 |

Note 1):
concentration in electrolyte after removal operation of Pb

It is apparent from Table 1 that, in the electrolyte in which the Cl ion concentration is controlled so as to be within the specified range in order to be able to form a uniform electrodeposited copper foil capable of forming a fine-pitch wiring pattern, the small amount of mixed lead (Pb) ions can be deposited as a lead/strontium composite and removed by the addition of specified amount of strontium carbonate. Irrespective of the addition of strontium carbonate, the electrodeposited copper foil of excellent performance which can meet fine-pitch requirements can be produced by virtue of the controlled Cl ion concentration.

Example 4

An electrodeposited copper foil was produced in the same manner as in Example 1 except that, in place of strontium carbonate, barium carbonate was added in an amount of 1000 mg/liter (135 g/g of Pb, in terms of lead (Pb) ions of the electrolyte, of barium carbonate, namely 142 mol of barium per mol of dissolved lead (Pb) ions).

With respect to the obtained electrodeposited copper foil, the number of fine particles of Pb and the copper foil properties were measured in the same manner as in Example 1.

The results are specified in Table 2.

Example 5

An electrodeposited copper foil was produced in the same manner as in Example 1 except that, in place of strontium carbonate, calcium carbonate was added in an amount of 75 mg/liter (10 g/g of Pb, in terms of lead (Pb) ions of the electrolyte, of calcium carbonate, namely 21 mol of calcium per mol of dissolved lead (Pb) ions).

With respect to the obtained electrodeposited copper foil, the number of fine particles of Pb and the copper foil properties were measured in the same manner as in Example 1.

The results are also specified in Table 2.

TABLE 2

| | Electrolyte | | | | Copper foil for printed wiring board | | | | |
|---|---|---|---|---|---|---|---|---|---|
| | amt. of added CaCO$_3$ BaCO$_3$ | concn. of Pb[2] (mg/L) | concn. of Ca[2] of Ba[2] (mg/L) | no. of detected Pb particles (/500 cm$^2$) | matte side profile | | | tensile strength (kg/mm$^2$) | Elongation (%) |
| | | | | | Ra | Rmax | Rz | | |
| Ex. 4 | 1000 mg | <0.2 | <0.2 | 0 | 0.37 | 3.2 | 2.3 | 56.8 | 4.3 |
| Ex. 5 | 75 mg | 0.4 | 17.8 | 0 | 0.44 | 4.0 | 3.1 | 56.0 | 5.2 |

Note 2):
concentration in electrolyte after removal operation of Pb

It is apparent from Table 2 that, in the electrolyte in which the Cl ion concentration is controlled so as to be within the specified range and in which lead (Pb) ions are contained as impurities, the concentration of lead (Pb) ions in the electrolyte can be efficiently lowered by the addition of specified amount of barium carbonate or calcium carbonate followed by filtration.

What is claimed is:

1. A process for producing an electrodeposited copper foil from an electrolyte containing copper sulfate dissolved therein, in which said electrolyte contains a small amount of lead (Pb) ions, said process comprising the steps of adding a salt of a metal of Group IIA of the periodic table to the electrolyte in an amount of 10 to 150 mols per mol of lead (Pb) ions contained in the electrolyte, reacting the lead (Pb) ions contained in the electrolyte with the metal of Group IIA of the periodic table to thereby form an insoluble composite substance, precipitating and removing said insoluble composite substance from the electrolyte and electrodepositing a copper foil from the electrolyte having the lead (Pb) ions removed therefrom.

2. A process of claim 1, wherein the electrolyte further contains chloride ions in a concentration of 0.1 to 5.0 mg/liter.

3. A process of claim 1, wherein said salt of a metal of Group IIA of the periodic table is a carbonate of at least one metal selected from the group consisting of strontium, barium and calcium.

4. A process of claim 1, wherein said salt of a metal of Group IIA of the periodic table is strontium carbonate and wherein the electrolyte further contains chloride ions in a concentration of 0.1 to 5.0 mg/liter.

5. A process of claim 1, wherein said salt of a metal of Group IIA of the periodic table is calcium carbonate and/or barium carbonate.

6. A process of claim 1, wherein said salt of a metal of Group IIA of the periodic table is added to the electrolyte so that a concentration of lead (Pb) ions remaining in the electrolyte is not greater than 1.0 mg/liter.

7. A process for producing an electrodeposited copper foil from an electrolyte containing copper sulfate dissolved therein, in which said electrolyte contains a small amount of lead (Pb) ions, and further contains chloride ions in a concentration of 0.1 to 5.0 mg/liter, said process comprising the steps of adding a salt of a metal of Group IIA of the periodic table to the electrolyte in an amount of 10 to 150 mols per mol of lead (Pb) ions contained in the electrolyte, reacting the lead (Pb) ions contained in the electrolyte with the metal of Group IIA of the periodic table to thereby form an insoluble composite substance, precipitating and removing said insoluble composite substance from the electrolyte and electrodepositing a copper foil from the electrolyte having the lead (Pb) ions removed therefrom.

8. A process for producing an electrodeposited copper foil from an electrolyte containing copper sulfate dissolved therein, in which said electrolyte contains a small amount of lead (Pb) ions and further contains chloride ions in a concentration of 0.1 to 5.0 mg/liter, said process comprising the steps of adding strontium carbonate to the electrolyte in an amount of 10 to 150 mols per mol of lead (Pb) ions contained in the electrolyte, reacting the lead (Pb) ions contained in the electrolyte with the strontium to thereby form an insoluble composite substance, precipitating and removing said insoluble composite substance from the electrolyte and electrodepositing a copper foil from the electrolyte having the lead (Pb) ions removed therefrom.

9. A process for producing an electrodeposited copper foil from an electrolyte containing copper sulfate dissolved therein, in which said electrolyte contains a small amount of lead (Pb) ions and further contains chloride ions in a concentration of 0.1 to 5.0 mg/liter, said process comprising the steps of adding calcium carbonate and/or barium carbonate to the electrolyte in an amount of 10 to 150 mols per mol of lead (Pb) ions contained in the electrolyte, reacting the lead (Pb) ions contained in the electrolyte with the calcium and/or barium to thereby form an insoluble composite substance, precipitating and removing said insoluble composite substance from the electrolyte and eletrodepositing a copper foil from the electrolyte having the lead (Pb) ions removed therefrom.

* * * * *

UNITED STATES PATENT AND TRADEMARK OFFICE
CERTIFICATE OF CORRECTION

PATENT NO. : 6,444,112 B1
DATED : September 3, 2002
INVENTOR(S) : Nobuyuki Imada et al.

It is certified that error appears in the above-identified patent and that said Letters Patent is hereby corrected as shown below:

Column 4,
Line 21, "ILA" should read -- IIA --.

Column 8,
Line 38, "carbon ate" should read -- carbonate --.

Column 10,
Line 50, " "modulation" " should read -- "nodulation" --.

Column 15,
Table 1, 3rd Column Under Heading Electrolyte "or" should read -- of --.

Column 16,
Line 29, "The-results" should read -- The results --.

Signed and Sealed this

Eighteenth Day of February, 2003

JAMES E. ROGAN
*Director of the United States Patent and Trademark Office*